(12) United States Patent
Devnani et al.

(10) Patent No.: US 6,630,628 B2
(45) Date of Patent: Oct. 7, 2003

(54) HIGH-PERFORMANCE LAMINATE FOR INTEGRATED CIRCUIT INTERCONNECTION

(75) Inventors: Nurwati S Devnani, Fort Collins, CO (US); William S Burton, Fort Collins, CO (US); Sari K Christensen, Ft. Collins, CO (US)

(73) Assignee: Agilent Technologies, Inc., Palo Alto, CA (US)

( * ) Notice: Subject to any disclaimer, the term of this patent is extended or adjusted under 35 U.S.C. 154(b) by 0 days.

(21) Appl. No.: 10/072,261

(22) Filed: Feb. 7, 2002

(65) Prior Publication Data

US 2003/0148077 A1 Aug. 7, 2003

(51) Int. Cl.[7] .............................. H05K 1/03; H05K 1/00
(52) U.S. Cl. ........................ 174/255; 174/260; 174/261; 174/262; 361/760; 361/792; 361/794; 257/737; 257/778
(58) Field of Search ................................ 174/255, 260, 174/262, 261; 361/760, 764, 780, 783, 792, 794, 795, 803; 257/737, 738, 778

(56) References Cited

U.S. PATENT DOCUMENTS

| | | | | |
|---|---|---|---|---|
| 5,446,243 A | * | 8/1995 | Crowder et al. | 174/250 |
| 5,856,913 A | * | 1/1999 | Heilbronner | 361/760 |
| 6,184,477 B1 | * | 2/2001 | Tanahashi | 174/261 |
| 6,184,478 B1 | * | 2/2001 | Imano et al. | 174/261 |
| 6,218,631 B1 | * | 4/2001 | Hetzel et al. | 174/261 |
| 6,255,600 B1 | * | 7/2001 | Schaper | 174/255 |
| 6,441,470 B1 | * | 8/2002 | Shenoy | 257/659 |

* cited by examiner

*Primary Examiner*—Kamand Cuneo
*Assistant Examiner*—J B Patel

(57) ABSTRACT

A high-performance, integrated circuit interconnection laminate. Power/ground layers in laminates fabricated with open areas to permit out gassing of gases generated during high temperature lamination are located such that they do not lie under/over critical traces on signal layers. This placement of the open areas enables a reduction in cross-talk between signal layers lying on opposite sides of a power/ground layer and a reduction in signal delay.

21 Claims, 9 Drawing Sheets

HIGH-PERFORMANCE LAMINATE FOR INTEGRATED CIRCUIT INTERCONNECTION

FIELD OF THE INVENTION

The present invention relates generally to the interconnection of integrated circuits and, more particularly, to the substrates on which the integrated circuits are mounted, and even more particularly to laminate combination build-ups for such substrates, and even more particularly to layers comprising large areas of metal as typically used for ground and power planes in such build-ups.

BACKGROUND OF THE INVENTION

Printed circuit boards and substrates used for the interconnection and packaging of integrated circuit chips are typically constructed by superimposing and laminating together thin layers of insulating and conducting materials. Common construction techniques involve a high temperature lamination cycle during which the bonding of the layers to each other occurs. The resulting bonded construct is typically referred to as a laminate.

Usually at least one of the layers of the laminate is a sheet of metal with interspersed openings. Depending upon its intended purpose, the metal can serve as either a ground plane or a power plane. In addition to providing low impedance access to ground and power potentials at a relatively constant potential across the extent of the construct, these metalized planes also provide an important shielding function. Signals from metal traces on a signal layer on one side of one of the metalized planes can be shielded from signals originating from metal traces on a signal layer on the opposite side of the metalized plane. This shielding is, however, somewhat imperfect as will be explained in the following.

During the high temperature lamination process, the organic materials used in the layers create gasses. If these gasses are not allowed to exit the laminate, the resulting voids in the laminate can result in a low bonding strength and create other problems. In order to provide a path for these gases to escape, it is necessary to create a series of openings in metalized planes across the extent of the laminate. The required size and proximity of the openings and overall percent of the open areas is processing dependent. Unfortunately, these openings provide a path for coupling signals from one side of the plane to traces on the other. The resulting cross-talk is especially acute for traces that pass over the openings. Thus, solving one problem, the creation of gasses in the laminate during lamination, creates another, cross-talk between signal layers on opposite sides of the metalized plane. The higher the frequency, the greater the cross-talk problem. Since modern electronic devices are typically being driven to higher and higher frequencies, the cross-talk problem is becoming more and more of a problem.

Thus there is a need for techniques to reduce the cross-talk between two signal layers on opposite sides of a metalized ground or power layer in a laminate used in printed circuit boards and substrates intended for the interconnection and packaging of integrated circuit chips.

SUMMARY OF THE INVENTION

In accordance with aspects of the present invention, high-performance laminates for interconnecting integrated circuits are disclosed which eliminate or substantially reduce the disadvantages associated with prior interconnection techniques.

In a representative embodiment of the present invention, an interconnecting laminate includes a signal layer overlaying a conducting power/ground layer and separated by a dielectric layer of specified thickness. The signal layer includes conducting traces, and the power/ground layer is primarily a sheet of conducting material with interspersed open areas. The open areas are an essential part of the fabrication process and provide the means by which dielectric layer gasses created during fabrication can escape. In the representative embodiment, the open areas required in the power/ground layer are displaced such that none of the openings is overlain by the signal layer. Additional signal layers are included in other embodiments.

Technical advantages of the embodiments disclosed include increased speed as distributed resistance and inductance in the conducting paths are reduced. The path of conduction followed in the power/ground layer is shorter than in earlier solutions. In addition, cross-talk between two closely spaced signal lines is minimized by shielding each of their signal paths from the other. Shielding is effected via placement of the signal layers on opposite sides of the power/ground layer, and by displacement of open areas such that the open areas do not overlay the conduction paths on the signal layers.

Other aspects and advantages of the present invention will become apparent from the following detailed description, taken in conjunction with the accompanying drawings, illustrating by way of example the principles of the invention.

BRIEF DESCRIPTION OF THE DRAWINGS

The accompanying drawings provide visual representations which will be used to more fully describe the invention and can be used by those skilled in the art to better understand it and its inherent advantages. In these drawings, like reference numerals identify corresponding elements and.

DETAILED DESCRIPTION OF THE PREFERRED EMBODIMENTS

Figure 1:
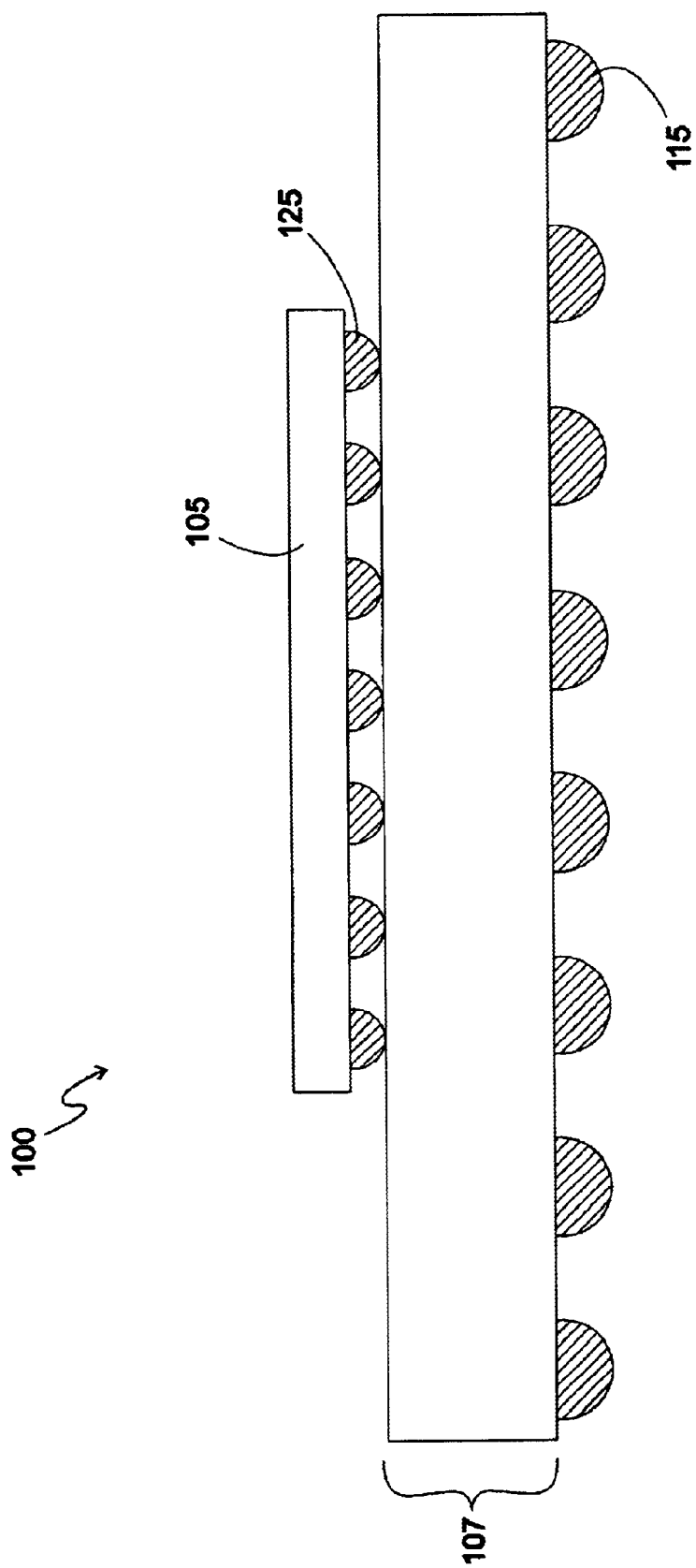
FIG. 1 is a drawing of a side view of an integrated circuit package as described in various representative embodiments of the present patent document.

As shown in the drawings for purposes of illustration, the present patent document relates to a novel method for constructing high-performance laminate interconnections for integrated circuit interconnection. Previous methods for such constructions have relied upon metalized layers which act as power/ground planes with uniformly spaced open areas to permit the escape of gasses generated during lamination. The required size of the openings and percent open areas is processing dependent. Metal traces from signal layers typically cross these open areas creating cross-talk to signal layers on the opposite side of the power/ground layer.

In the following detailed description and in the several figures of the drawings, like elements are identified with like reference numerals.

FIG. 1 is a drawing of a side view of an integrated circuit package 100 as described in various representative embodiments of the present patent document. In FIG. 1, an integrated circuit 105, also referred to herein as an integrated circuit chip 105 and which in this example is a flip-chip 105, is mounted to a ball grid array substrate 107 via solder bumps 125. Connection from the integrated circuit package 100 is made via ball grid array pins 115, also referred to herein as package pins 115. Items shown in the drawings are for illustrative purposes. As such, these items are not drawn to the relative proportions to which they would be constructed in a practical application.

Figure 2:
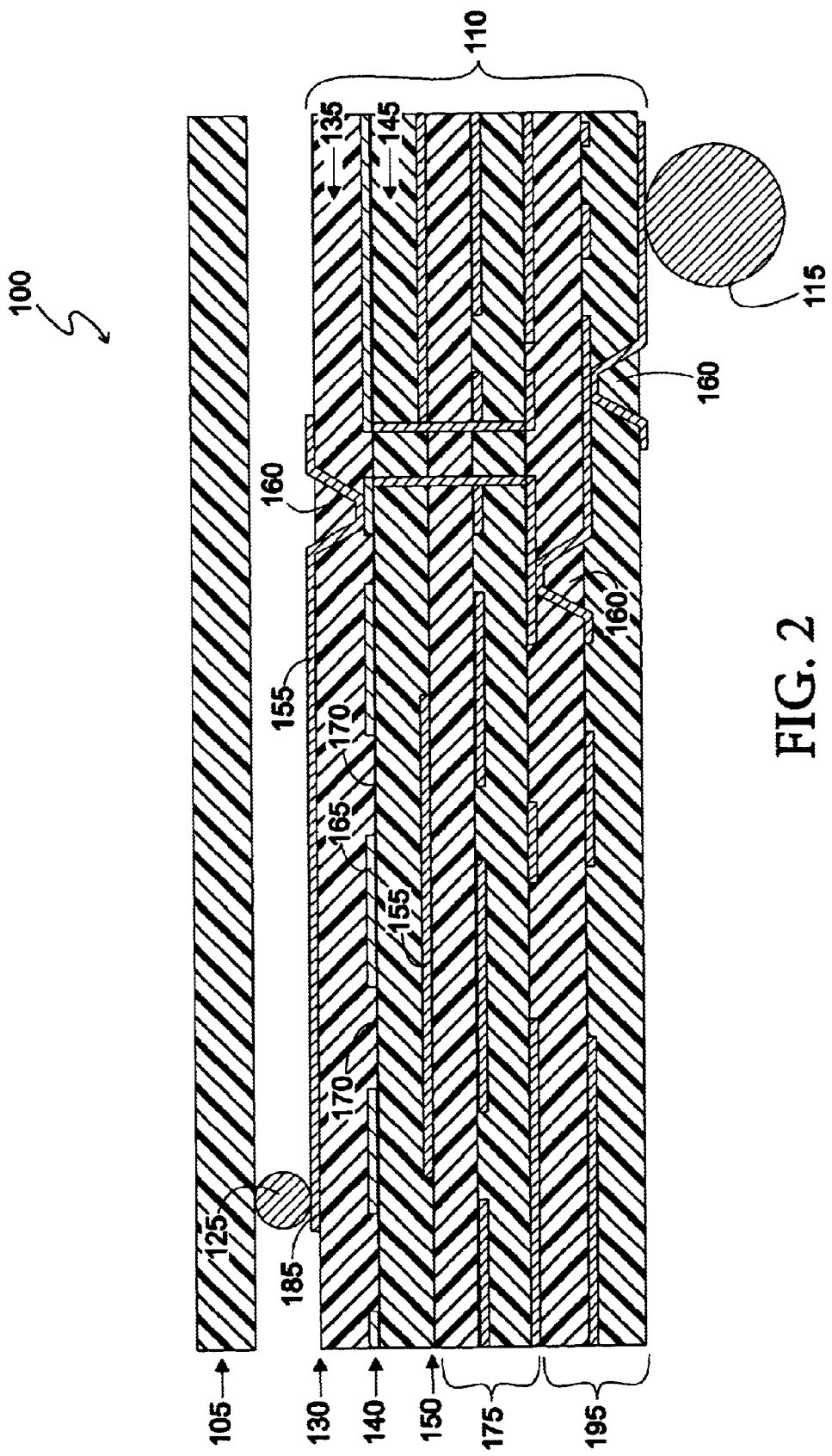
FIG. 2 is a drawing of a cross-sectional view of a segment of the integrated circuit package as described in various representative embodiments of the present patent document.

FIG. 2 is a drawing of a cross-sectional view of a segment of the integrated circuit package 100 as described in various representative embodiments of the present patent document. In a first example, as shown in FIG. 2, the integrated circuit 105 is mounted to an interconnecting laminate 110. In this example, the integrated circuit chip 105 is flip-chip 105 wherein solder bumps 125 fabricated onto metalized pads on the chip 105 are used to make electrical connection as well as to mount the chip 105 to the interconnecting laminate substrate 110.

In the example of FIG. 2, the interconnecting laminate 110 comprises a first signal layer 130, also referred to herein as a third layer 130, a first insulating layer 135, also referred to herein as a second layer 135, a power/ground layer 140, also referred to herein as a first layer 140, a second insulating layer 145, also referred to herein as a fourth layer 145, and a second signal layer 150, also referred to herein as a fifth layer 150.

These top layers rest on a core 175 and on the opposite side of the core 175 there are additional laminate layers 195, which are similar in character and construction to the top layers.

The solder bumps 125 are soldered to pads 185 on the surface of the laminate substrate 110. The pads 185 then connect to electrically conducting traces 155 on the first signal layer 130. The combination of traces 155 and vias 160 provides a path for the signal to traverse through the layers 130, 135, 140, 145, 150, 175, 195 to make contact with the package pins 115. It will be understood by one of average skill in the art that other applications are possible, as for example, multiple chips 105 mounted in the same package 100 and multiple integrated circuit packages 100 mounted on a printed circuit board wherein the printed circuit board performs a similar interconnection function as shown in FIG. 2. It will also be understood by one of average skill in the art that other layer stack configurations and constructs with multiple signal, insulating, ground and power layers present in practical applications are not shown in FIG. 2. These items have not been shown for clarity of illustration.

The power/ground layer 140 comprises an electrically conducting area 165 and open areas 170. In this example, one of the open areas 170 is located directly over trace 155 on second signal layer 150 and directly under trace 155 located on first signal layer 130 resulting in a relatively strong cross-talk between the two traces 155.

Figure 3:
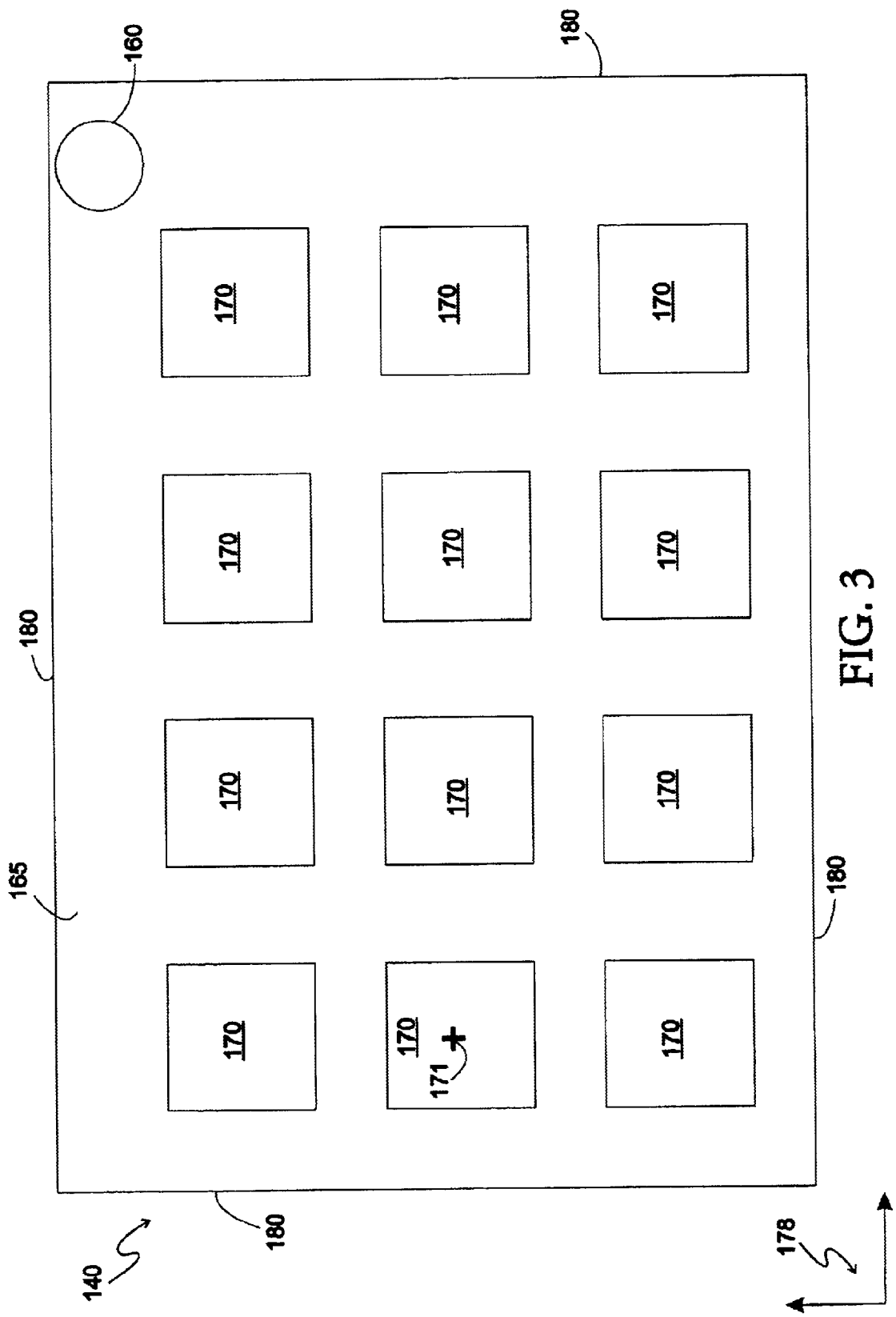
FIG. 3 is a drawing of a power/ground layer as described in various representative embodiments of the present patent document.

FIG. 3 is a drawing of power/ground layer 140 as described in various representative embodiments of the present patent document. For clarity of illustration, FIG. 3 shows only a part of the power/ground layer 140 of the laminate 110 of the example of FIG. 2. As previously stated, the power/ground layer 140 comprises the electrically conducting area 165 and multiple open areas 170. The open areas each have a centroid 171, only one of which is shown in FIG. 3 for clarity of illustration. The open areas 170 in a typical application have a repeating size, a repeating shape, and a repeating orientation with respect to a Cartesian coordinate system 178, and the open areas 170 are interspersed inside an outer perimeter 180 of the electrically conducting area 165. Also shown is the opening for via 160 in the power/ground layer 140.

Figure 4:
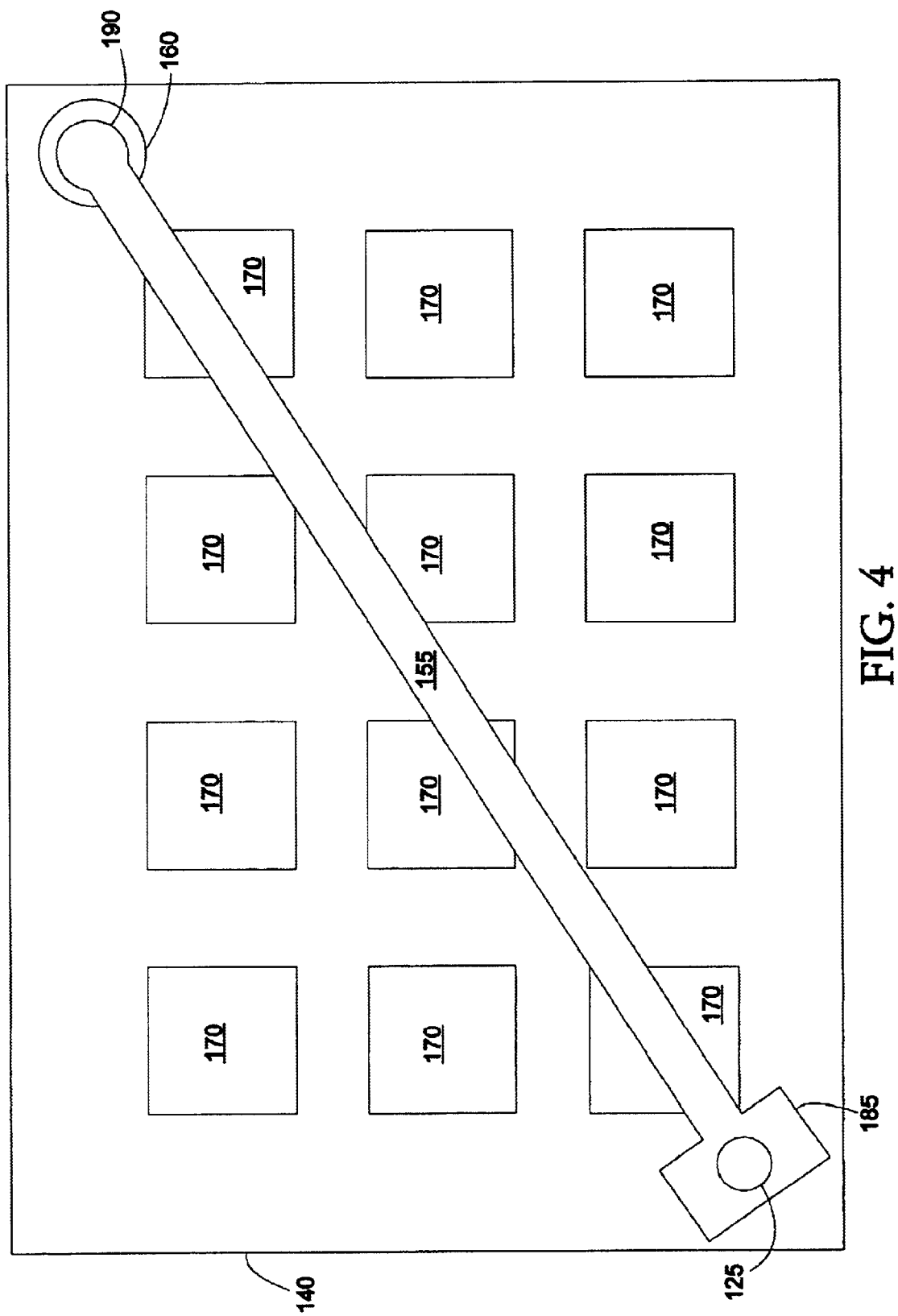
FIG. 4 is a drawing of overlaid layers as described in various representative embodiments of the present patent document.

FIG. 4 is a drawing of overlaid layers as described in various representative embodiments of the present patent document. Shown in FIG. 4 is the power/ground layer 140 of the example of FIG. 3 which is only a part of the example of FIG. 2. Also, shown overlaying the power/ground layer 140 is solder bump 125 bonded to solder bump pad 185 attached to trace 155 on the first signal layer 130. The opposite end of trace 155 is connected to a capture pad 190, also referred to as a land 190, that connects to the via 160 which is then connected to a series of additional traces and vias to provide electrical connection to one of the package pins 115. In FIG. 4, as well as FIG. 2, the trace 155 overlays several open areas 170.

Figure 5:
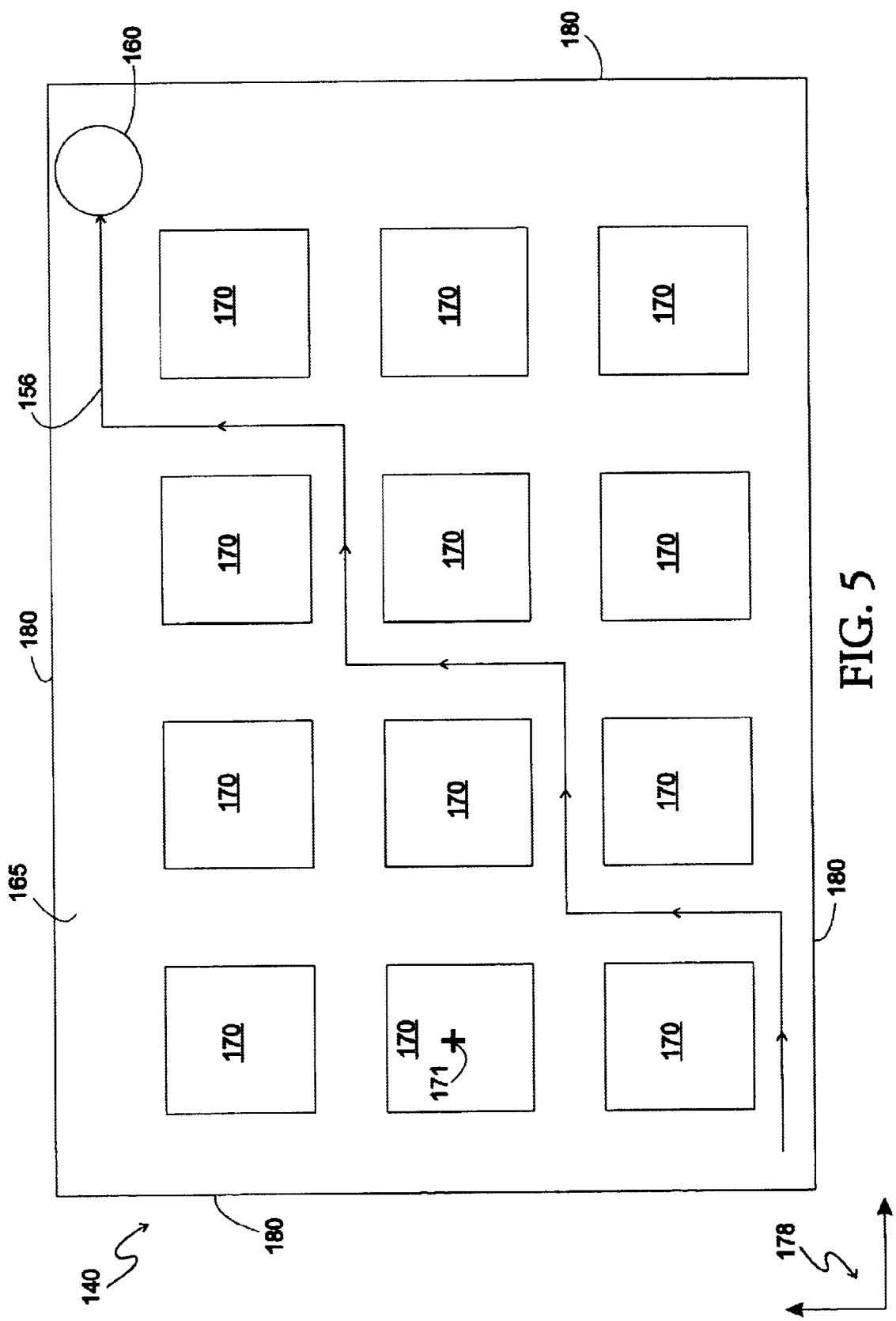
FIG. 5 is another drawing of power/ground layer as described in various representative embodiments of the present patent document.

FIG. 5 is another drawing of power/ground layer 140 as described in various representative embodiments of the present patent document. In FIG. 5, an effective return path 156 on the power/ground layer 140 for the signal carried by the trace 155 on the first signal layer 130 is shown. Note that this effective return path 156 is longer than it would be if the trace 155 did not overlay the open areas 170.

Figure 6:
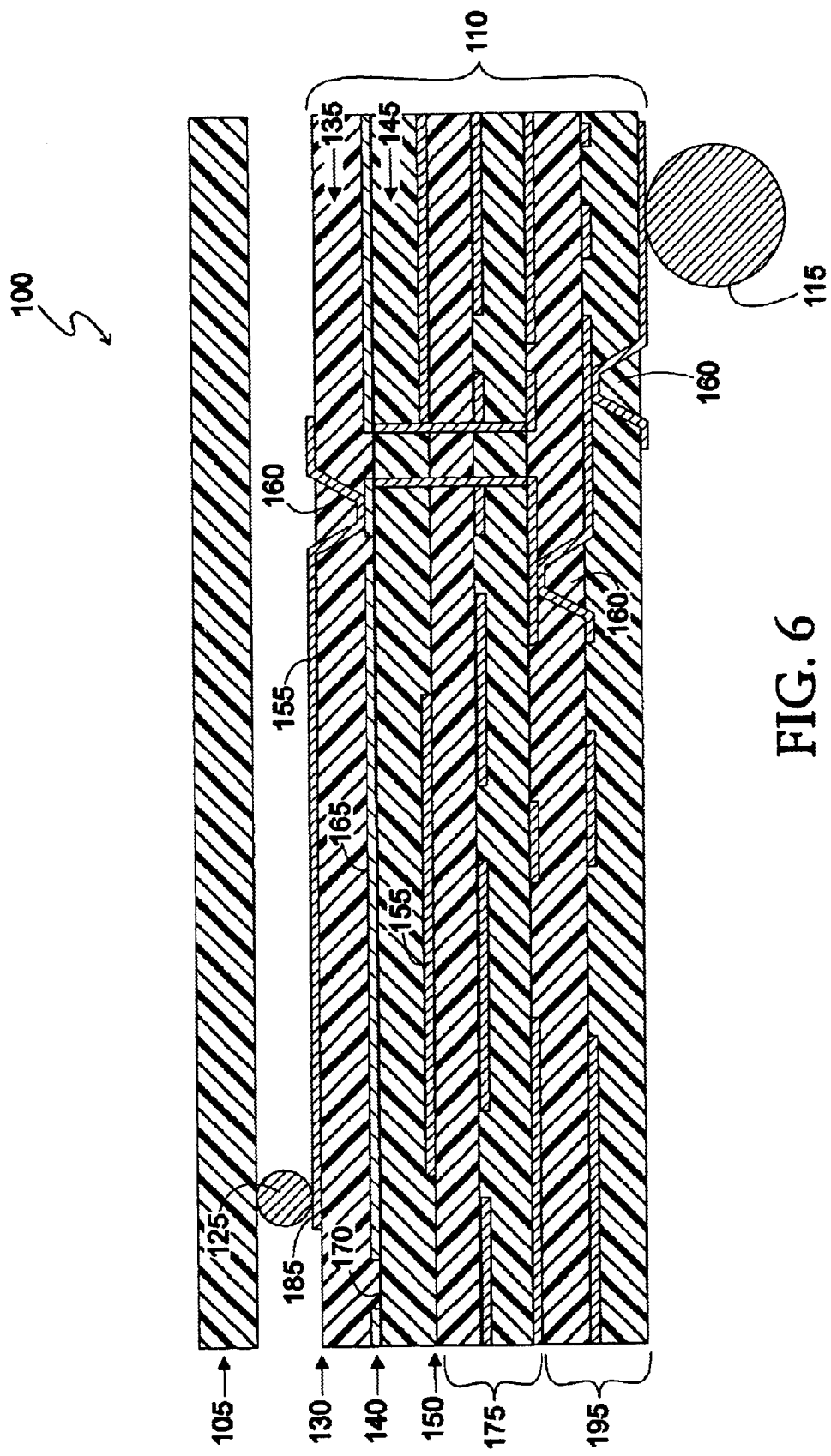
FIG. 6 is another drawing of the cross-section of the integrated circuit package as described in various representative embodiments of the present patent document.

FIG. 6 is another drawing of the cross-section of the integrated circuit package 100 as described in various representative embodiments of the present patent document. In the preferred embodiment of FIG. 6, the interconnecting laminate 110 comprises the first signal layer 130, the first insulating layer 135, the power/ground layer 140, the second insulating layer 145, and the second signal layer 150. These top layers rest on the core 175. On the opposite side of the core there are additional laminate layers 195.

The solder bumps 125 are soldered to pads 185 on the surface of the laminate substrate 110. The pads 185 then connect to electrically conducting traces 155 on the first signal layer 130. The combination of traces 155 and vias 160 provides a path for the signal to traverse through the layers 130, 135, 140, 145, 150, 175, 195 to make contact with the package pins 115. Again, it will be understood by one of average skill in the art that other layers and constructs which would be present in practical applications are not shown in FIG. 6. These items have not been shown for clarity of illustration.

The power/ground layer 140 comprises the electrically conducting area 165 and open areas 170. In this second example, open areas 170 are located so that they do not lie directly over trace 155 on second signal layer 150, and open areas 170 are located so that they do not lie directly under trace 155 located on first signal layer 130. The construct of FIG. 6 results in very good shielding between the two traces 155 with associated relatively reduced cross-talk.

Figure 7:
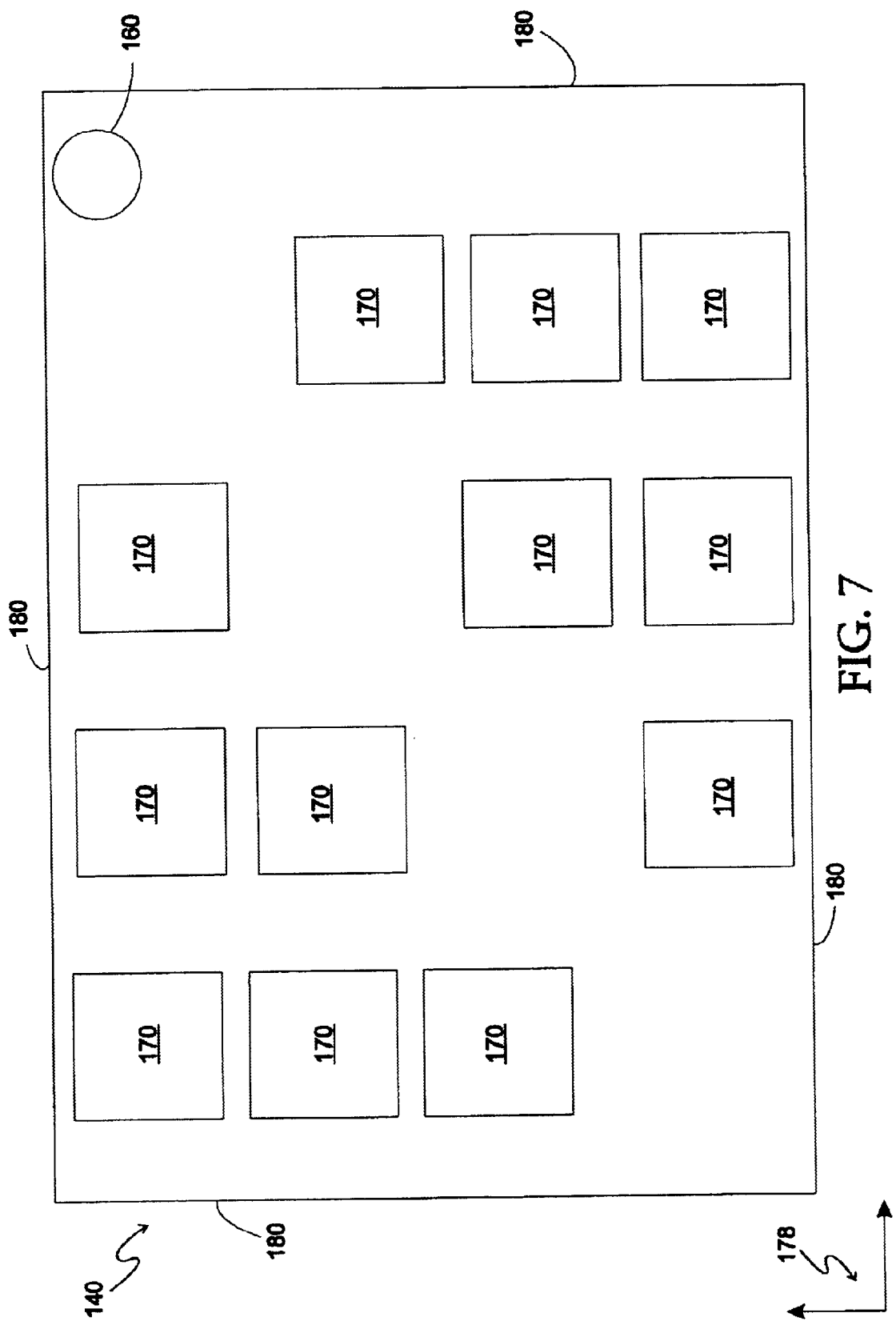
FIG. 7 is yet another drawing of the power/ground layer as described in various representative embodiments of the present patent document.

FIG. 7 is yet another drawing of the power/ground layer 140 as described in various representative embodiments of the present patent document. For clarity of illustration, FIG. 7 shows only a part of the power/ground layer 140 of the laminate 110 of the example of FIG. 6. As previously stated, the power/ground layer 140 comprises the electrically conducting area 165 and multiple open areas 170. The open areas 170 generally have a repeating size, a repeating shape, and a repeating orientation with respect to the Cartesian coordinate system 178, and the open areas 170 are interspersed inside the outer perimeter 180 of the electrically conducting area 165. Also shown is the opening for via 160 in the power/ground layer 140. Many different patterns may be created when designing and fabricating the open areas 170 to achieve the percent area coverage needed for the effective release of the gases from the laminate substrate 110. These open areas 170 may be random in both shape, size, and/or placement, or they may be repeating in shape and/or size with or without being regular in their placement. The percentage of the power/ground layer 140 consumed by the open areas 170 will be preferably greater than or equal to 10% and less than or equal to 30%.

Figure 8:
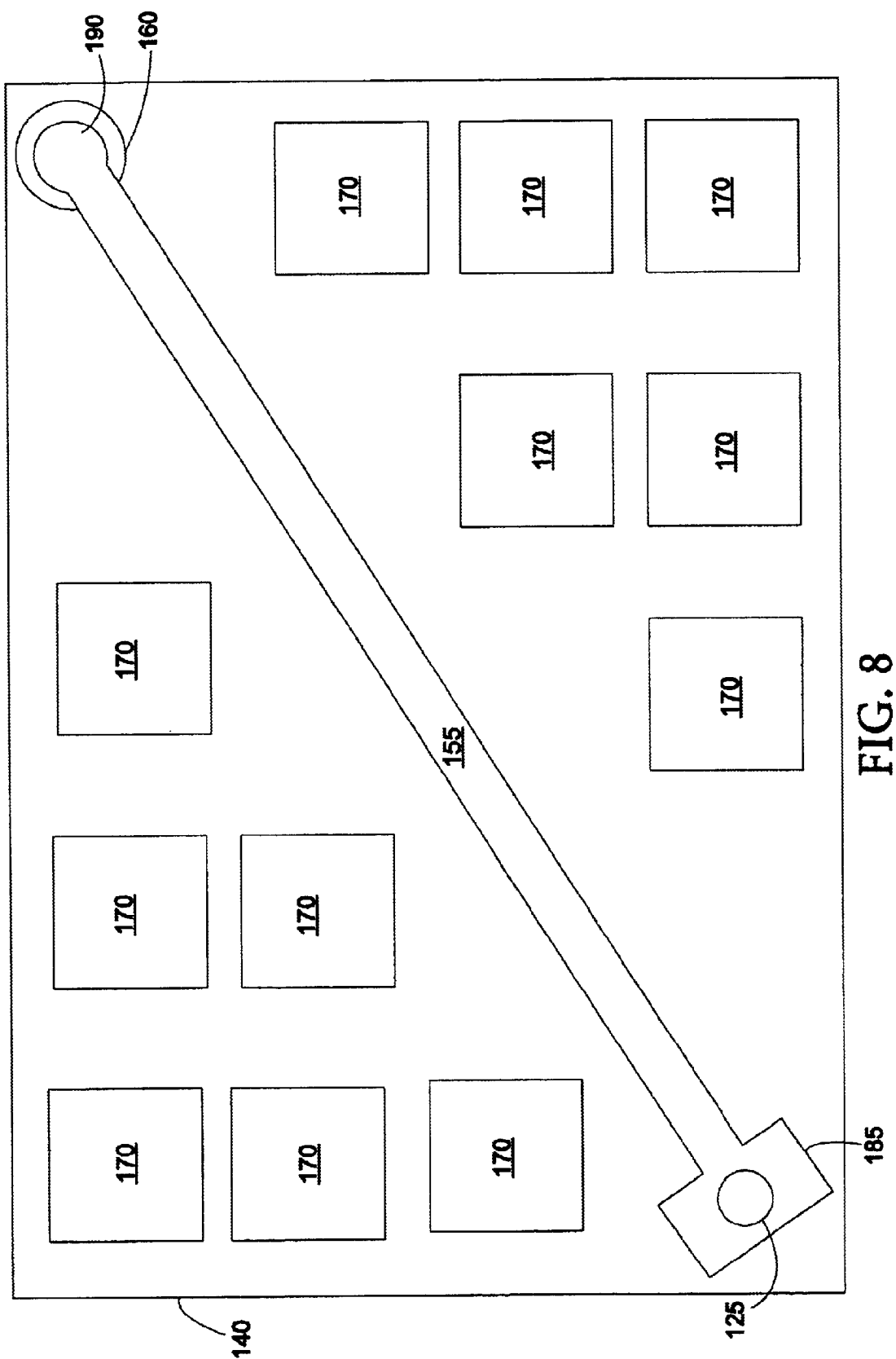
FIG. 8 is another drawing of overlaid layers as described in various representative embodiments of the present patent document.

FIG. 8 is another drawing of overlaid layers as described in various representative embodiments of the present patent document. Shown in FIG. 8 is the power/ground layer 140 of the example of FIG. 7 which is only a part of the example of FIG. 6. Also, shown overlaying the power/ground layer 140 is solder bump 125 bonded to solder bump pad 185 attached to trace 155 on the first signal layer 130. The opposite end of trace 155 connected to capture pad 190 that connects to the via 160 which is then connected to a series of additional traces and vias to provide electrical connection to one of the package pins 115. Note that in FIG. 8, as well as FIG. 6, the trace 155 on first signal layer 130 overlays only electrically conducting area 165 on the power/ground layer 140. As stated above, the construct of FIGS. 5, 6, and 7 results in very good shielding between the two traces 155 with associated relatively reduced cross-talk talk.

In addition, the effective inductance and resistance of traces for the first example of FIGS. 2 and 4 is greater than that for the traces 155 and power/ground layer 140 return path of the second example of FIGS. 6 and 8 which would result in a greater delay time and thus speed of the packaged integrated circuit 105.

Figure 9:
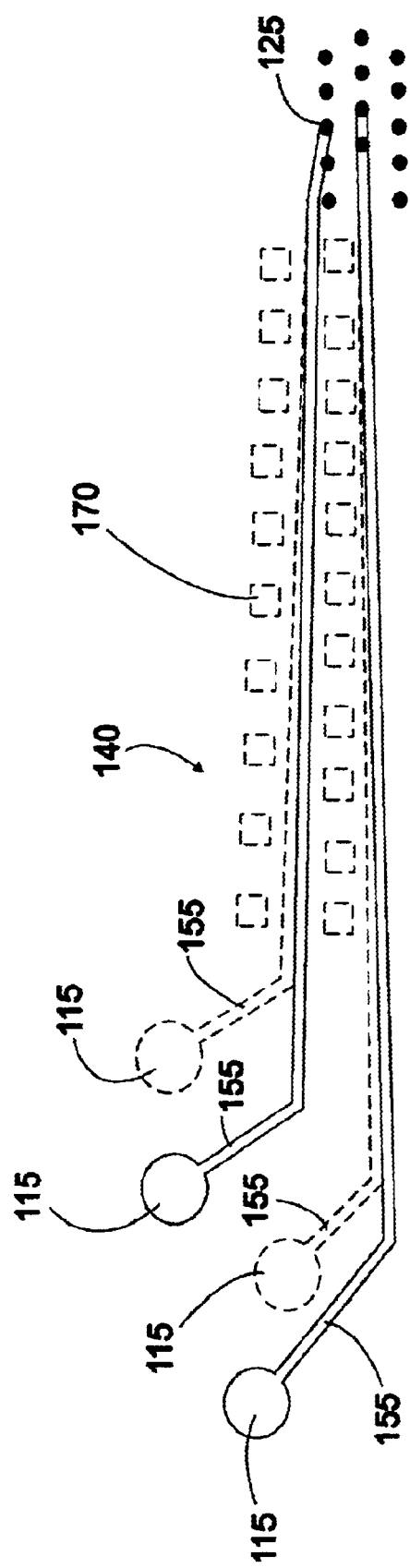
FIG. 9 is a drawing of a topside view of overlaid layers as described in various representative embodiments of the present patent document.

FIG. 9 is a drawing of a topside view of overlaid layers as described in various representative embodiments of the present patent document. In FIG. 9, multiple traces 155 on first and second signal layers 130,150 originating from closely spaced end points, as for example neighbor solder bumps 125, and terminating on more widely spaced end points, as for example, package pins 115, would form a radial appearing pattern on both signal layers 130,150 and on power/ground layer 140.

A primary advantage of the embodiment as described in the present patent document over prior techniques for the construction of power/ground layers 140 in interconnecting laminate 110 for integrated circuit chips 105 is the reduction in cross-talk between signal layers 130,150 lying on opposite sides of the power/ground layer 140. A further advantage is the reduction in the effective resistance and inductance of the interconnecting traces 155.

While the present invention has been described in detail in relation to preferred embodiments thereof, the described embodiments have been presented by way of example and not by way of limitation. It will be understood by those of ordinary skill in the art that various changes may be made in the form and details of the described embodiments resulting in equivalent embodiments that remain within the scope of the appended claims.

What is claimed is:

1. A laminate for interconnecting an integrated circuit chip, which comprises:

a first layer, wherein the first layer comprises an electrically conducting area and multiple open areas, wherein centroids of two of the open areas define one axis of a Cartesian coordinate system, and wherein the open areas are interspersed inside an outer perimeter of the electrically conducting area;

a second layer, wherein the second layer is electrically insulating, wherein the second layer overlays the first layer; and a third layer, wherein the third layer comprises multiple electrically conducting traces, wherein the third layer overlays the second layer, wherein at least one of the traces is oriented at other than an orthogonal angle to each axis of the coordinate system, wherein the oriented trace is longer than the spatial extension between two of the open areas, and wherein the projection of the oriented conducting trace onto the first layer lies external to the open areas.

2. The laminate as recited in claim 1, wherein the open areas on the first layer sum to a total open area of at least 10 percent and less than 30 percent of the total area of the first layer.

3. The laminate as recited in claim 1, further comprising: the integrated circuit, wherein the integrated circuit is attached to the laminate.

4. The laminate as recited in claim 1, further comprising:

a substrate, wherein the laminate is attached to the substrate.

5. The laminate as recited in claim 1, wherein the laminate is mounted in an integrated circuit package.

6. The laminate as recited in claim 1, wherein the laminate is fabricated as part of a printed circuit board.

7. The laminate as recited in claim 1, wherein the second layer material is selected from the group consisting of epoxy resin and teflon.

8. The laminate as recited in claim 1, further comprising:

a fourth layer, wherein the fourth layer is electrically insulating, wherein the first layer overlays the fourth layer; and a fifth layer, wherein the fifth layer comprises at least one electrically conducting trace, wherein the fourth layer overlays the fifth layer, wherein at least one of the traces is oriented at other than an orthogonal angle to each axis of the coordinate system, wherein the oriented trace is longer than the spatial extension between two of the open areas, and wherein the projection of the oriented conducting trace onto the first layer lies external to the open areas.

9. The laminate as recited in claim 8, wherein the second layer and the fourth layer materials are selected from the group consisting of epoxy resin and teflon.

10. The laminate as recited in claim 1, wherein the open areas have a repeating shape and a repeating size.

11. The laminate as recited in claim 10, wherein the open areas have a repeating orientation with respect to a Cartesian coordinate system.

12. A printed circuit board for interconnecting an integrated circuit chip, which comprises:
   a laminate comprising:
   a first layer, wherein the first layer comprises an electrically conducting area and multiple open areas, wherein an outer perimeter of the printed circuit board defines the axes of a Cartesian coordinate system, and wherein the open areas are interspersed inside an outer perimeter of the electrically conducting area;
   a second layer, wherein the second layer is electrically insulating, wherein the second layer overlays the first layer; and
   a third layer, wherein the third layer comprises multiple electrically conducting traces, wherein the third layer overlays the second layer, wherein at least one of the traces is oriented at other than an orthogonal angle to each axis of the coordinate system, wherein the oriented trace is longer than the spatial extension between two of the open areas, and wherein the projection of the oriented conducting trace onto the first layer lies external to the open areas.

13. The printed circuit board as recited in claim 12, wherein the open areas on the first layer sum to a total open area of at least 10 percent and less than 30 percent of the total area of the first layer.

14. The printed circuit board as recited in claim 12, further comprising:
   the integrated circuit attached to the printed circuit board.

15. The printed circuit board as recited in claim 12, further comprising:
   a substrate attached to the laminate.

16. The printed circuit board as recited in claim 12, wherein the printed circuit board is mounted in an integrated circuit package.

17. The printed circuit board as recited in claim 12, wherein the second layer material is selected from the group consisting of epoxy resin and teflon.

18. The printed circuit board as recited in claim 12, further comprising:
   a fourth layer, wherein the fourth layer is electrically insulating, wherein the first layer overlays the fourth layer; and
   a fifth layer, wherein the fifth layer comprises at least one electrically conducting trace, wherein the fourth layer overlays the fifth layer, wherein at least one of the traces is oriented at other than an orthogonal angle to each axis of the coordinate system, wherein the oriented trace is longer than the spatial extension between two of the open areas, and wherein the projection of the oriented conducting trace onto the first layer lies external to the open areas.

19. The printed circuit board as recited in claim 18, wherein the second layer and the fourth layer materials are selected from the group consisting of epoxy resin and teflon.

20. The printed circuit board as recited in claim 12, wherein the open areas have a repeating shape and a repeating size.

21. The printed circuit board as recited in claim 20, wherein the open areas have a repeating orientation with respect to a Cartesian coordinate system.

* * * * *